United States Patent
Kondo et al.

(10) Patent No.: US 6,562,719 B2
(45) Date of Patent: May 13, 2003

(54) METHODS OF POLISHING, INTERCONNECT-FABRICATION, AND PRODUCING SEMICONDUCTOR DEVICES

(75) Inventors: Seiichi Kondo, Leuven (BE); Noriyuki Sakuma, Hachioji (JP); Yoshio Homma, Hinode (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/828,919

(22) Filed: Apr. 10, 2001

(65) Prior Publication Data

US 2002/0016073 A1 Feb. 7, 2002

(30) Foreign Application Priority Data

Aug. 4, 2000 (JP) ........................ 2000-242750

(51) Int. Cl.⁷ ...................... H01L 21/302; H01L 21/461
(52) U.S. Cl. ........................... 438/691; 438/687
(58) Field of Search ................. 438/633, 637, 438/648, 687, 691, 692, 693, 622, 627

(56) References Cited

U.S. PATENT DOCUMENTS 3,878,250 A * 4/1975 Sato et al.
4,415,460 A * 11/1983 Suciu et al.
4,944,836 A   7/1990 Beyer et al.
5,084,071 A   1/1992 Nenadic et al.
5,770,095 A   6/1998 Sasaki et al.
6,068,787 A   5/2000 Grumbine et al.
6,126,853 A * 10/2000 Kaufman et al.
6,323,554 B1 * 11/2001 Joshi et al.
6,326,299 B1 * 12/2001 Homma et al.

FOREIGN PATENT DOCUMENTS

| JP | 52-21222 | 2/1977 |
| JP | 55-47382 | 4/1980 |
| JP | 2-278822 | 11/1990 |
| JP | 6-57455 | 3/1994 |
| JP | 7-94455 | 4/1995 |
| JP | 8-83780 | 3/1996 |
| JP | 10-116804 | 5/1998 |
| JP | 10-265766 | 10/1998 |
| JP | 11-21546 | 1/1999 |
| JP | 11-135466 | 5/1999 |

* cited by examiner

*Primary Examiner*—David Nelms
*Assistant Examiner*—Phuc T. Dang

(57) ABSTRACT

The present invention provides a technique to reduce and suppress scratches and delamination, to suppress and control the development of dishing and erosion, and to polish at high polishing rate. Polishing is performed using a polishing solution, which contains an oxidizer, phosphoric acid, organic acid, a chemical to form inhibition layer, and water.

20 Claims, 11 Drawing Sheets

POLISHING SOLUTION CONTAINING
SILICA-ABRASIVE POWER

ABRASIVE FREE POLISHING SOLUTION (a1)

(b1)

(a2)

(b2)

(a3)

(b3)

(a4)

(b4)

(a5)

METHODS OF POLISHING, INTERCONNECT-FABRICATION, AND PRODUCING SEMICONDUCTOR DEVICES

PRIORITY TO FOREIGN APPLICATIONS

This application claims priority to Japanese Patent Application No.P2000-242750.

BACKGROUND OF THE INVENTION

1. Field of the Invention

The present invention relates to polishing of a metal film, and in particular, to a method of polishing in an interconnect-fabrication process for producing semiconductor devices.

2. Description of the Background

In recent years, with rapid progress and development in the techniques available to produce semiconductor integrated circuits, such as large scale semiconductor integrated circuits (hereinafter referred as "LSI"), with greater integration and improved performance characteristics, new techniques for fabrication have been developed. One of these techniques is chemical-mechanical polishing (hereinafter referred as "CMP"), which is a technique frequently used in processes such as LSI manufacturing—in particular, CMP is used in the flattening of an inter-layer insulating film, the formation of metal plug, and the formation of buried interconnect layer in the process to form a multi-level interconnection. This technique is disclosed, for example, in U.S. Pat. No. 4,944,836.

Further, attempts have been made in recent years to utilize copper (Cu) alloy with low resistance as the material for interconnection, rather than the aluminum (Al) alloy used in the past, with the purpose of producing high-performance LSIs. However, for Cu alloy, it is difficult to carry out fine fabrication based on dry etching methods, which methods have been frequently used for the formation of Al alloy interconnects. For this reason, the "damascene" method has been primarily adopted, wherein a Cu alloy thin film is deposited on an insulating film formed with grooves fabricated thereon, and the Cu alloy thin film other than that buried in the grooves is removed by CMP, and buried interconnect is thereby prepared. This technique is disclosed, for example, in JP-A-2-278822. It is generally practiced to place a barrier metal film, such as a titanium nitride (TiN) film, a tantalum (Ta) film or a tantalum nitride (TaN) film, of several tens of nm in thickness, for the purposes of improving adhesive properties and of providing Cu diffusion barrier between the Cu alloy thin film and the insulating film.

In the past, the polishing solutions used in CMP, for metal films such as the Cu alloy commonly used for interconnects, generally contained abrasive power and oxidizer (oxidizing chemicals) as the main components. The basic CMP mechanism is oxidization of the surface of a metal film by the oxidizing action of the oxidizer, and the mechanical removal of the oxides by the abrasive powder. This technique is disclosed, for example, in "The Science of CMP" (edited by Masahiro Kashiwagi; published by Science Forum Co., Ltd.; Aug. 20, 1997, p.299)

Abrasive powders, such as alumina abrasive powder or silica abrasive powder, of several tens to several hundreds of nm in grain diameter, are known in the art. Most types of abrasive powder for metal CMP that are commercially available are alumina type powders.

As the oxidizer, hydrogen peroxide ($H_2O_2$), ferric nitrate ($Fe(NO_3)_3$), and potassium periodate ($KIO_3$) are generally used. These are described, for example, in "The Science of CMP" (pp.299–300). Among these substances, hydrogen peroxide has been more frequently used in recent years, due to the fact that it does not contain metal ions.

However, when interconnects and/or plugs are fabricated using the polishing solution, which contains an abrasive powder for conventional type metal CMP as the main component, the following problems occur:

(1) Development of dishing (depression on interconnect) and erosion (corrosion and scraping of the insulating film on the peripheral portion of the interconnect);

(2) Development of scratches (polishing scratches);

(3) Delamination;

(4) The need to remove abrasive powder by ishing after CMP;

(5) High cost for abrasives;

(6) High cost for abrasive supply system and iste liquid processing system; and (7) Dust in clean room originated from CMP system.

The above problems are caused by the fact that CMP is performed using abrasive powder. In the conventional CMP methods, however, the abrasive powder is needed to quickly remove oxide layers formed by the oxidizer. If abrasive powder is not added, it is not possible to reach a polishing rate (i.e. a polishing speed) that is suitable for practical use.

In contrast, JP-A-11-135466 discloses a method for polishing metal film using a polishing solution not containing abrasive powder, and for fabricating a buried interconnect structure. According to this method, using a polishing solution containing an oxidizer, a substance to turn the oxides to water-soluble, water and, if necessary, an anti-corrosive substance (for forming inhibition layer), the surface of the metal film is mechanically scrubbed, and a buried metal interconnect can be prepared on the surface. For example, a Cu interconnect is produced using an abrasive-free polishing solution, which contains hydrogen peroxide, citric acid, and benzotriazole (hereinafter referred as "BTA").

The problems (1) to (7) described hereinabove may be solved when the above abrasive-free polishing solution method is used, while a acceptable polishing rate (speed) under normal polishing conditions of 80–150 nm/min is maintained. Even when high polishing load of 300 $g/cm^2$ or more is applied, the polishing rate reaches the saturation level and does not go beyond 200 nm/min, and thus it is not possible to increase the throughput beyond this limit. In the case wherein a commercial alumina polishing solution is used, a polishing rate as high as 300–500 nm/min may be reached by applying a high polishing load. In this case, however, the problems of scratches and delamination become more serious.

On the other hand, a number of different approaches to these difficulties are available. One such approach is presented in JP-A-7-94455, which discloses a phosphoric acid aqueous solution as one of abrasive polishing solutions for Cu (see Example 4 of the above publication). It is described therein that the ratio of polishing rate of Cu to the insulating film can be increased up to 14.5 by using the abrasive polishing solution containing phosphoric acid of 3% concentration (see FIG. 5 of the above publication, wherein the Cu content is 100%). However, using experimentation, it is very difficult to attain a polishing rate of 50 nm/min. or more under practical polishing condition (i.e. polishing load of 500 $g/cm^2$ or less; rotational speed of platen at 90 rpm or less) by the simple combination of abrasive powder and phosphoric acid aqueous solution. If the abrasive powder is removed, the polishing rate is less than 20 nm/min. Therefore, although the ratio of polishing rate is high using this abrasive polishing solution, it is not possible to carry out polishing with a sufficient throughput and high accuracy (without developing erosion).

In the abrasive polishing solution for tungsten CMP disclosed in JP-A-10-265776, phosphoric acid or organic acid is used as a stabilizer. In this case, the stabilizer is a chemical to suppress and control the reaction between a catalyst (ferric nitrate) added in the polishing solution, and the oxidizer (hydrogen peroxide). According to experimentation, an etching rate for Cu of this polishing solution is more than 100 nm/min, and, using this solution, it is possible to polish Cu film, but a Cu interconnect is eliminated by the etching. This polishing solution is specifically directed to tungsten CMP and is not generally applicable for Cu-CMP. Thus, using the teachings of JP-A-10-265776, it is not possible to achieve high-speed polishing of Cu by simultaneously adding phosphoric acid and organic acid (in particular, lactic acid) to the polishing solution not containing abrasive powder.

A polishing solution for Cu-CMP is disclosed in JP-A-11-21546. This polishing solution includes abrasive powder, an oxidizer (e.g. urea—hydrogen peroxide), a chemical to form complex salt (e.g. ammonium oxalate or organic acid such as lactic acid), a film forming agent (e.g. BTA, imidazole), and a surface active agent. It is described in the above patent publication that inorganic acid, such as phosphoric acid, may be added in order to adjust the pH value of the polishing solution, or to promote the polishing rate of the barrier metal film. The surface active agent as described in this publication is used to reduce or suppress setting, agglutination and decomposition of the abrasive powder. By experimentation, it is practically difficult to polish Cu film using the polishing solution when the abrasive powder is removed from the polishing solution described in the above publication. That is, in this polishing solution, it is essential to mechanically remove Cu oxides via the abrasive powder. Thus, using the teachings of this publication, it is not possible to achieve high-speed polishing of Cu by simultaneously adding phosphoric acid and organic acid (in particular, lactic acid) using the polishing solution not containing abrasive powder as a main component.

A polishing solution not containing abrasive powder is disclosed in JP-A-52-21222 as a chemical polishing solution to be used for Cu ornaments on camera components. The polishing solution comprises a surface active agent, hydrogen peroxide, sulfuric acid, and phosphoric acid, and this teaching provides improved luster by polishing a Cu surface using emery abrasive paper with abrasive powder attached on it. The surface active agent has an effect to provide better luster by improving wettability of the polishing surface. According to experimentation, the etching rate of the polishing solution is 1000 nm/min. or more, and it is not possible to use this as the polishing solution for fabricating a buried Cu interconnect on the level of several hundreds of nm.

JP-A-55-47382 and JP-A-6-57455 each disclose a polishing solution not containing abrasive powder. The former is a chemical polishing solution used for deburring of machine components made of aluminum. It comprises an acid (including phosphoric acid) and aluminum chelating agent of aromatic compound. A surface active agent and hydrogen peroxide are added when necessary. The latter is a chemical polishing solution for pretreatment in the plating of brass, and it includes hydrogen peroxide, oxy-quinoline, a chemical to form complex salt, and a surface active agent. Phosphoric acid and sulfuric acid are added when necessary, and it is used for adjusting luster or satin finish. The surface active agent is added for the purposes of improving the wettability and of preventing mist caused by bubbling. In any of these chemical polishing solutions, the etching rate is 100 nm/min. or more, and these are the polishing solutions for polishing (without scrubbing) based on etching action. Therefore, these are not suitable for the use as the polishing solutions to fabricate the buried Cu interconnect of the present invention. As the polishing solution used for the buried interconnect of LSI, it is necessary to provide surface flatness on the level of nanometer. The required level of flatness (i.e. luster) should be higher than the luster level achievable by these polishing solutions.

A preferred etching rate for Cu of a polishing solution is less than 10 nm/min. The reasons are as follows: The thickness of the interconnect layer of a semiconductor device, to which the polishing solution is applied, is generally 300-1000 nm. Where the polishing is performed for several minutes, and where a polishing solution with an etching rate of about 100 nm is applied, for example, the Cu on the interconnect layer may be etched as deep as several hundreds of nm. That is, dishing may reach several hundreds of nm in depth. In order to suppress the dishing to several tens of nm, the etching rate of the polishing solution is preferably limited to less than 10 nm. Further, if over-polishing time is taken into account, it is preferably less than 1 nm/min.

The addition of anti-corrosive agent to the polishing solution has been already disclosed with the purpose of suppressing the etching. A method to add an anti-corrosive agent such as BTA, imidazole, or benzimidazole to the polishing solution for Cu is disclosed in patent publications such as JP-A-11-21546, JP-A-8-83780, and JP-A-10-116804. However, in all of these cases, the method described is the addition of anti-corrosive agent to the polishing solution containing abrasive powder. It has been asserted that a sufficient polishing rate cannot be obtained if an anti-corrosive agent is added to a polishing solution not containing abrasive powder. JP-A-11-135466 disclosed that Cu could be polished if BTA is added to an abrasive-free polishing solution. However, it has been asserted that it is not practical to add an anti-corrosive agent having higher anti-corrosive property than BTA to a polishing solution, because the polishing rate, as well as the etching rate, would be reduced or suppressed.

Therefore, the need exists for a polishing method and a method for producing semiconductor devices, by which it is possible to solve the problems (1) to (7) hereinabove in the process to fabricate a buried metal interconnect, and to achieve high-speed polishing rate (700 nm/min. or more) with improved etch rate control.

SUMMARY OF THE INVENTION

To overcome the difficulties mentioned hereinabove, it is an object of the present invention to provide a polishing method, and a method for producing semiconductor devices, by which it is possible to solve problems (1) to (7) hereinabove in the process to fabricate a buried metal interconnect, and to achieve high-speed polishing rate (700 nm/min. or more) with improved etch rate control.

The above object is attained by the method for polishing a metal film, comprising the steps of using a polishing solution which contains an oxidizer, phosphoric acid, organic acid, a chemical to form inhibition layer, and water, and of mechanically scrubbing surface of the metal film.

Phosphoric acid has an effect to efficiently turn oxides (on the surface of the metal film oxidized by an oxidizer) into water-soluble state. A representative example of the phosphoric acid used is orthophosphoric acid. Unless otherwise specified, orthophosphoric acid is referred hereinafter as phosphoric acid. In addition to orthophosphoric acid, the following substances may be used: phosphorous acid (phosphonic acid), hypophosphorous acid (phosphinic acid), metaphosphoric acid, polyphosphoric acid (e.g. diphosphoric acid (pyrophosphoric acid)), or substances containing the phosphoric acid group. Among these substances, orthophosphoric acid and phosphorous acid have the highest effect to increase the polishing rate. Also, orthophosphoric acid is advantageous in that it is chemically stable and low in cost. Phosphorous acid and hypophosphorous acid are advantageous in that each is less harmful in the polishing solution as compared to orthophosphoric acid. Orthophosphoric acid and phosphorous acid are advantageous in that each is less stimulant and irritant as compared to hypophosphorous acid or metaphosphoric acid. Phosphorous acid is advantageous in that surface roughness is caused on the polishing surface less frequently as compared to orthophosphoric acid.

Organic acid has an effect to act on the surface of the metal film, together with phosphoric acid, and to efficiently turn the metal oxides to water-soluble. Compared with the case wherein the phosphoric acid or the organic acid as mentioned hereinabove is added alone, polishing performance can be improved further if the two are used together. Among the organic acids, carboxylic acid, or hydrocarboxylic acid containing hydroxyl group or carboxyl group, have the effect of increasing the polishing rate. For example, the following substances may be used: organic acid, such as citric acid, malic acid, malonic acid, succinic acid, tartaric acid, phthalic acid, maleic acid, fumaric acid lactic acid (α-hydroxypropionic acid or β-hydroxypropionic acid), pimelic acid, adipic acid, glutaric acid, oxalic acid, salicylic acid, glycolic acid, tricarballylic acid, benzoic acid, formic acid, acetic acid, propionic acid, butyric acid, valeric acid, acrylic acid, and salts of these acids. The salt has an effect to increase solubility. These chemicals may be used in combinations of two or more.

Among these acids, it is preferable to use the following substances as the organic acid added to the polishing solution of the present invention to achieve high polishing rate and low etching rate: malonic acid, tartaric acid, malic acid, citric acid, succinic acid, maleic acid, fumaric acid, glycolic acid, tricarballylic acid, lactic acid (α-hydroxypropionic acid or β-hydroxypropionic acid).

Among the above acids, lactic acid (α-hydroxypropionic acid) is commonly used as a food additive. It has low toxicity, is less harmful as a waste liquid, has no offensive odor, has high solubility in water, and can be produced at low cost. Additionally, lactic acid has a large effect to increase the polishing rate, and serves as a solvent for the anti-corrosive agent discussed hereinbelow. Thus, it is the most desirable substance to be used as the organic acid in the polishing solution of the present invention.

As a substance to suppress excessive oxidation or etching of the metal film, it is effective to use a chemical to form an inhibition layer. On order to form the inhibition layer, a chemical is used that has an effect to decrease the etching rate of the metal to be polished when it is added to the polishing solution, thus making it possible to suppress the development of dishing on Cu interconnect, which may occur after the interconnect fabrication. Before the chemical to form inhibition layer is added to the polishing solution of the present invention, the etching rate is more than 50 nm/min. That is, it is a polishing solution having essentially a high corrosive property. By adding the chemical to form the inhibition layer to the polishing solution, an anticorrosive effect can be provided, and thus the present invention is thereby made suitable for the use as the polishing solution for CMP. More concretely, it is preferable to obtain an etching rate of less than 10 nm/min.

As the chemical to form the inhibition layer, an anti-corrosive agent to Cu alloy is the most preferable. The following substances may be used: BTA, imidazole, benzimidazole, naphthotriazole, benzothiazole, or a derivative of these substances. Imidazole is suitable because it has high solubility in water. Imidazole derivative is suitable because its solubility can be increased by lactic acid and it can increase the polishing rate for Cu. BTA derivative is suitable because it can suppress the etching rate for Cu.

As the BTA derivative, the following substances may be used: 4-methyl-1.H-benzotriazole, tolyltriazole, 4-carboxyl-1.H-benzotriazole, 5-methyl-1.H-benzotriazole, tolyltriazole, benzotriazole butyl ester, 5-chloro-1.H-benzotriazole, 1-chlorobenzotriazole, 1-hydroxybenzotriazole, 1-dihydroxybenzotriazole, 2,3-dicarboxylpropyl benzotriazole, 4-hydroxybenzotriazole, 4-carboxyl-1.H-benzotriazole methyl ester, 4-carboxyl-1.H-benzotriazole butyl ester, 4-carboxyl-1.H-benzotriazole octyl ester, 5-hexyl benzotriazole, [1,2,3-benzotriazolyl-1-methyl][1,2,4-triazolyl-1-methyl][2-ethylhexyl]amine, 5,6-dimethyl-1.H-benzotriazole, etc.

As the imidazole derivative, the following substances may be used: 4-methylimidazole, 4-methyl-5-hydroxymethyl-imidazole, 1-phenyl-4-methylimidazole, 1-(p-tolyl)-4-methylimidazole, long-chain alkyl imidazole, etc.

As the benzimidazole derivative, the following substances may be used: 2-mercapto benzimidazole, 2-(n-methylpropyl)-benzimidazole (n=1, 2), 2-(n-methylbutyl-benzimidazole (n=1, 2, 3), 2-(1-ethylpropyl)-benzimidazole, 2-(1-ethylpropyl)-methylbenzimidazole, 2-n-alkyl-methylbenzimidazole, 2-(4-butylphenyl)-benzimidazole, 2-phenylmethyl-methylbenzimidazole, 2-cycloalkyl-benzimidazole, etc.

As the benzthiazole derivative, 2-mercapto benzthiazole, 2,1,3-benzthiazole, etc. may be used.

As the other anti-corrosive agent, the following substances may be used: benzofuroxan, o-phenylenediamine, M-phenylenediamine, catechol, o-aminophenol, 2-mercapto benzooxazole, melamine, thiourea, etc.

It is very effective to add a solvent for increasing solubility of the chemical to form the inhibition layer in the polishing solution. In a case wherein the temperature of the polishing solution is decreased to nearly 0 degrees Celsius, or in the case wherein the other additive is added, the solubility of the chemical to form the inhibition layer is decreased to lower than the solubility in pure water, and thus it may be crystallized and deposited in the polishing solution. Thus, it is preferable that it is set to a solubility more than twice as high as the solubility in pure water at room temperature. For example, in a case wherein BTA is used as the chemical to form the inhibition layer, the solubility of BTA is increased by more than two times by adding methanol of about 1% to the polishing solution. The same effect can be obtained by adding ethanol or isopropyl alcohol, ethylene glycol, polyethylene glycol, methyl ethyl ketone, or heptanol. Also, hydroxy acid such as lactic acid, citric acid, etc. has an effect to increase the solubility. In particular, it is more preferable to use lactic acid than citric acid because lactic acid can provide a greater increase the polishing rate. However, in some cases, citric acid is more preferable in view of the increase of solubility.

As the other chemical to form inhibition layer, a surface active agent or a thickener may be used. These polymers are adsorbed on interface between the polishing solution and the metal during CMP, and form a polymer inhibition film. This has an effect to suppress the etching. Because these substances are not selectively adsorbed on Cu, it is suitable for general-purpose application.

Among these polymers, it is more preferable to use the polymer containing carboxyl group for the purpose of improving the polishing rate on the metal. For example, polyacrylic acid, polymethacrylic acid and ammonium salt of these acids, triethanolamine salt, monoethanolamine salt, triethylamine salt, diisopropanolamine salt, etc. may be used.

A polymer having higher molecular weight provides a greater effect to form inhibition layer. In particular, a ladder polymer having a high thickening effect has an effect to increase the polishing rate. For example, crosslinking type polyacrylic acid, and its salt, are suitable for this purpose.

Among the surface active agents are polymers having anti-bacterial or anti-fungal effect. These polymers have the effect to increase the polishing performance, and are useful to prevent the growth of fungi or bacteria in the polishing solution during storage, or in iste liquid. For example, cetyl pyridinium chloride may be used for this purpose.

When two types of the chemicals to form the inhibition layer are mixed and used, it is possible to increase the polishing rate more than the case wherein these are separately used. For example, anti-corrosive agent and surface active agent, or anti-corrosive agent and thickener may be used in combination. More concretely, a substance is selected from a first group, which comprises BTA, imidazole and a derivative of these substances, and a substance is selected from a second group, which comprises polyacrylic acid, crosslinking type polyacrylic acid or ammonium salt and cetyl pyridinium chloride. Then, these two types of substances are used in combination.

The oxidizer is a substance having an effect to oxidize the surface of the metal film to be polished. Hydrogen peroxide is the most suitable, because it contains no metallic component. Also, nitric acid, ferric nitrate, or potassium periodate may be used, because these have sufficient oxidizing potency if the metal components give no hindrance. These oxidizers may be used in combination of two types or more.

Regarding the abrasive powder, in a case wherein alumina abrasive powder or silica abrasive powder is contained in the polishing solution of the present invention, an effect to increase the polishing rate is further obtained. However, the problems as described hereinabove ((1) to (7)) may occur, and the abrasive powder can be used when there is no such problem. The content of the abrasive powder in the polishing solution varies according to each individual purpose, as discussed hereinbelow. The purpose to suppress the development of dishing and erosion can be attained by setting the concentration of the abrasive powder to less than 0.05 weight %. For the purpose of decreasing the scratches on the surface of the insulating film, the concentration of the abrasive powder should be decreased to less than 0.5 weight %. For the purpose of reducing the scratches on the surface of the metal film, the concentration of the abrasive powder should be set to less than 0.1 weight %. For the purpose of decreasing delamination, the concentration of the abrasive powder should be set to less than 0.3 weight %. For the purpose of improving ishability, the concentration of the abrasive powder should be set to less than 0.01 weight %. For the purpose of decreasing the cost of the polishing solution, the concentration of the abrasive powder should be set to less than 0.001 weight %. For the purpose of solving the problem of the cost for the abrasive supply system or iste liquid processing system, the concentration of the abrasive should be set to less than 0.0001 weight %. For the purpose of suppressing and reducing the dust in the clean room, the abrasive powder should not be added.

In the fabrication of the buried Cu interconnect, if an abrasive-free polishing solution is used for the polishing of the Cu, and the polishing solution containing abrasive powder is used for the polishing of the barrier metal, i.e. if two-step polishing is performed, the problems (1), (2), (5) and (6) described hereinabove can be extensively improved. A single CMP system provided with two or more polishing platens may be used, or two CMP systems provided with a polishing platen may be used. In this case, using the abrasive-free polishing solution, the polishing can be performed at higher rate compared with the polishing of the barrier metal film, and difficulties such as polishing residues of Cu film and barrier metal film in lower depression can be avoided. As to the methods to supply the polishing solution, one method separately supplies the solution to the polishing platen for Cu and the polishing platen for the barrier metal. On the other hand, there is also a method to supply the abrasive-free polishing solution to the polishing platen for Cu and to the polishing platen for barrier metal, and further, the solution containing abrasive powder is supplied to the polishing platen for barrier metal.

Also, it is possible to use a polishing pad (stationary abrasive pad) with abrasive powder buried in it, or to use a grindstone. As a result, the content of the abrasive powder in the polishing solution can be decreased, and this makes it easier to solve the problem of iste liquid processing in (6) as described hereinabove. In the case wherein a stationary abrasive pad or grindstone is used instead of free abrasive, it is advantageous because surface flatness can be improved even when CMP is performed in one step, thus solving the problem (1) as described hereinabove.

In the case wherein polishing is performed in two steps as described hereinabove, a polishing selection ratio can be changed between the first step and the second step. One effective method is to decrease the polishing rate for Cu in the second step in order to suppress the development of erosion and dishing. For this purpose, it is recommended to increase the concentration of the chemical to form inhibition layer in the polishing solution in the second step, and to increase the polishing rate for barrier metal film as compared with the polishing rate for Cu. For example, by increasing the concentration of the anti-corrosive agent, it is possible to increase the selection ratio for the barrier metal/Cu by more than two times. Even when it is not added to the polishing solution, if BTA aqueous solution of high concentration (about 1%) is supplied to the polishing platen at the same time as the polishing solution, the same effect can be provided.

When CMP is performed in two steps, a chemical exclusively used for the barrier may be used. For example, an abrasive-free polishing solution comprising hydrogen peroxide and aromatic nitro compound may be used for TiN. The aromatic nitro compound has an effect as an oxidizer to promote the etching of titanium compound. When necessary, the above chemical to form the inhibition layer may be added. Compared with the polishing solution containing abrasive powder, the polishing rate is low, but the process for fabricating the Cu interconnect can be turned to a completely abrasive-free process.

As the aromatic nitro compound as described above, the following substances may be used: nitrobenzene sulfonic acid, nitrophenol sulfonic acid, 1-nitronaphthalene-2-sulfonic acid, sulfonic acid salt of these compounds, nitrobenzoic acid, 4-chlor-3-nitro-benzoic acid, nitro-phthalic acid, isonitro-phthalic acid, nitro-terephthalic acid, 3-nitro-salicylic acid, 3,5-dinitrosalicylic acid, picric acid, aminonitro-benzoic acid, nitro-l-naphthoic acid, or carboxylic acid salt of these compounds may be used. The salts as described hereinabove include sodium salt, potassium salt, ammonium salt, etc. As the chemical to be used for the semiconductor devices, it is most preferable to use ammonium salt. Next, it is preferable to use potassium salt because it has lower diffusion coefficient in semiconductor devices. These chemicals may be used alone or in combinations of two or more. Among these aromatic nitro compounds, nitrobenzene sulfonic acid and its salt are most preferable because the polishing rate and the etching rate for TiN are high. The aromatic nitro compound may be used in the polishing solution and the etching solution of the present invention at a concentration of 0.1–30 weight %, or more preferably 1–20 weight %.

Instead of the two-step polishing as described hereinabove, there is a complete abrasive-free process combined with drying etching method. Specifically, the abrasive-free CMP is performed for Cu in the first step, and barrier metal film is removed by dry etching method in the second step, and a damascene Cu interconnect can be fabricated. This makes it possible to solve the problems of (1) to (7) as described hereinabove. As the gas to be used in the dry etching method for barrier metal, sulfur hexafluoride ($SF_6$) is the most suitable. $SF_6$ generates a large amount of F radicals due to plasma dissociation, and it is advantageous to use this for selectively removing TiN or TaN. Further, the reactivity with Cu appears to be low. It is preferable that an etching selection ratio of Cu to barrier metal is 3 or more. To extend the process margin further, it is preferably 5 or more.

The polishing of the present invention can be applied for the metal film to be polished such as Cu, Ti, TiN, Ta, TaN, WN, WSiN, etc. In particular, Cu has high polishing rate when the abrasive-free polishing solution is used, and it is the most suitable as the metal to be polished by the method of the present invention. In case of Ti, TiN, Ta, TaN, WN, or WSiN, the polishing rate when the abrasive-free polishing solution is used is not as high as that of Cu, but the method can be applied by using the polishing solution containing abrasive powder.

When CMP is performed using the polishing solution of the present invention, which comprises oxidizer, phosphoric acid, organic acid and the chemical to form the inhibition layer, the surface of Cu film is first covered with and protected by the chemical to form the inhibition layer. A projected portion 27 on the surface of Cu film as shown in FIG. 2(a), and is constantly subjected to mechanical scrubbing of the abrasive cloth. The inhibition or protective layer formed by the chemical to form the inhibition layer is easily removed. The surface of Cu film exposed to the polishing solution is oxidized by the oxidizer, and a thin oxide layer is formed on the surface. Next, when phosphoric acid and organic acid are supplied, the oxide layer is turned to aqueous solution and is eluted. As a result, the thickness of the oxide layer is reduced. The portion with thinner oxide layer is exposed again to the oxidizer, and the thickness of the oxide layer is increased. These reactions are repeated, and CMP process is continued. Therefore, on the projected portion 27 on the surface of Cu film, reaction products on the surface can be easily removed. Because of local heating, reaction is accelerated, and the repeated reactions of oxidation and actions to turn to a water-soluble state proceed more rapidly than on the recess 26, where the anti-corrosive protective film is formed. That is, the polishing rate is increased on the projected portion 27 and it is thereby flattened.

The chemical to form inhibition layer is attached on the surface of the metal film, and suppresses the reaction on the recess 26, and further prevents the development of dishing. The chemical to form inhibition layer commonly used as an anti-corrosive agent, such as BTA derivative, forms a very firm protective film on the surface of Cu film. Also, a polymer having a surface active effect, such as polyacrylic acid, forms a polymer film on the interface between the polishing solution and the Cu surface, and provides an effect as the anti-corrosive agent.

Regarding the concentration of the chemical to form the inhibition layer in the polishing solution, it is preferable that the polishing rate should be maintained at 700 nm/min. or more, and etching rate should be 10 nm/min. or less (Speed ratio: 70 or more). More preferably, it is 1 nm/min. or less (speed ratio: 700 or more). If the chemical to form the inhibition layer is added at a concentration higher than this, CPM rate may be decreased. If it is added at a concentration lower than this, the etching rate is increased. As a result of the lower concentration, CMP can be carried out, but dishing would develop more frequently.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 13(a1) shows the development of erosion in a first interconnect layer, FIG. 13(a2) shows surface irregularities (convex and concave portions) formed on an insulating film surface, reflecting the erosion on the first interconnect layer after the formation of the insulating film, FIG. 13(a3) shows the formation of a Cu film to provide a second interconnect layer, FIG. 13(a4) shows polishing residues generated when Cu-CMP is performed on the second interconnect layer, FIG. 13(a5) shows how the polishing residues are removed by over-CMP, wherein the arrows in FIG. 13(a1) and FIG. 13(a5) show expansion of the erosion; and FIG. 13(b1) shows he formation of the first interconnect layer without developing erosion, and FIG. 13(b2) shows how the insulating film is formed in flat shape. FIG. 13(b3) shows how Cu film is formed to provide the second interconnect layer, and FIG. 13(b4) shows how the second interconnect layer is formed without developing erosion.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical semiconductor application. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

EXAMPLE 1

Figure 1:
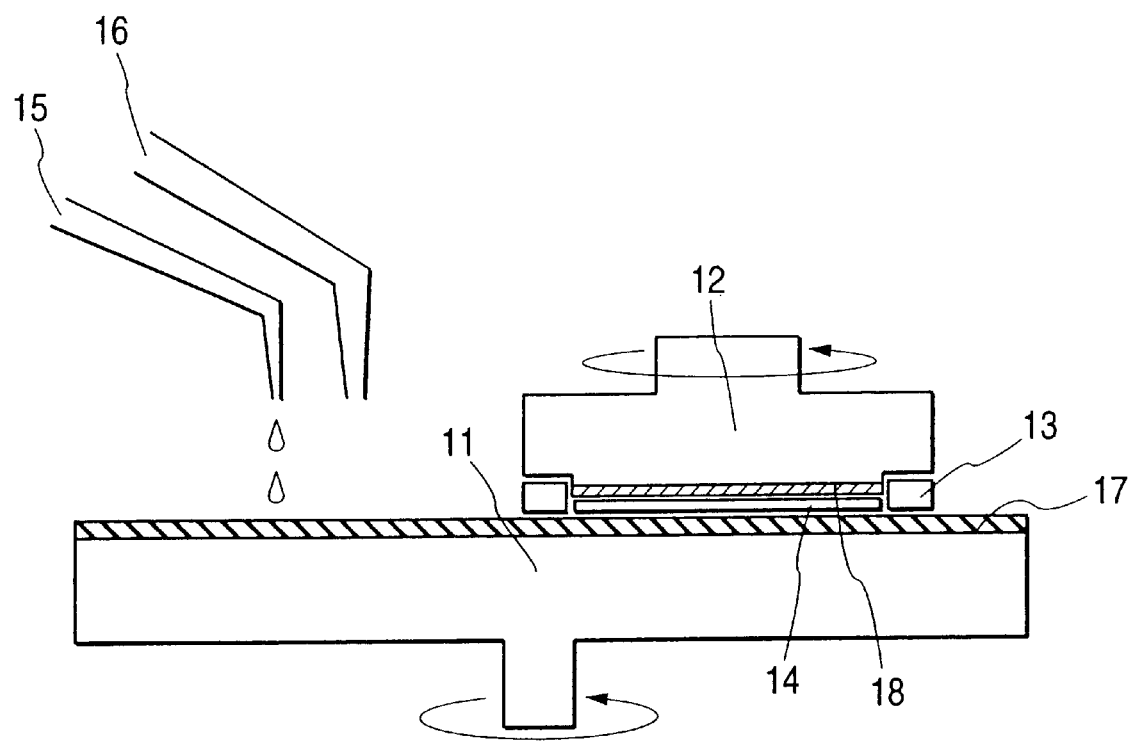
FIG. 1 is schematic drawing of the CMP (chemical-mechanical polishing) system.

In the first exemplary embodiment, a description will be given for a method of forming a Cu interconnect by performing Cu-CMP. FIG. 1 is a schematic drawing of a cross-sectional view of a CMP (chemical-mechanical polishing) system used in the present invention. On a platen (surface plate) 11 where an abrasive cloth 17 is attached, a holder 12 supporting a wafer 14 by a backing pad 18 is rotated to perform CMP. A retainer ring 13 is preferably provided to prevent the wafer from falling off during CMP. Polishing load during CMP is adjusted by a load applied on the holder 12. Standard polishing load is set to 220 g/cm$^2$, the number of revolutions of the platen is set to 60 rpm, and the number of revolutions of the holder is set to 60 rpm. The polishing load or the number of revolutions are not limited to these values, as these values are exemplary only. An abrasive cloth, such as a hard cloth IC1000 manufactured by Rodel Inc., may be used. If necessary, an abrasive cloth with groove may be used. Similar polishing rate (speed) may be attained when an abrasive cloth IC1400 of dual layer structure is used.

Figure 8:
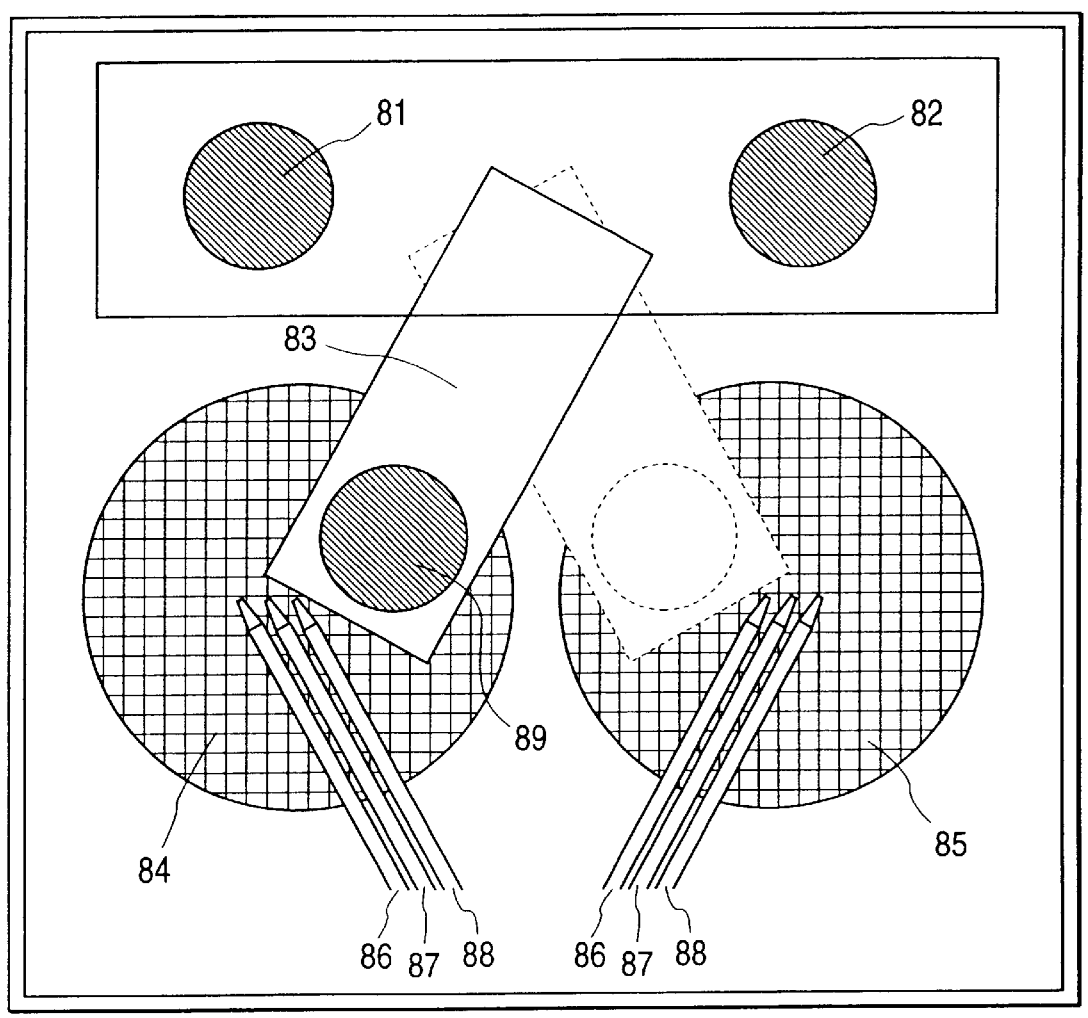
FIG. 8 is a top view of a 2-step CMP system, to which the present invention is applied.

FIG. 8 is an external view wherein a CMP system is seen from above. There are two platens (surface plates) for polishing, each designed in the same structure. A first platen 84 is used for polishing of Cu, and a second platen 85 is used for polishing of a barrier metal. On both platens, abrasive cloth is attached. A transport mechanism 83 carries a wafer 89 between these two platens, and continuous polishing can be carried out (in two steps). Reference numeral 81 denotes a wafer loader, and 82 is an unloader. Further, three platens may be provided to perform buff polishing.

The polishing solution of the present invention is dropped down to perform CMP at a rate of about 200 cc/min. from a first feeding outlet 15 provided above the platen 11 as shown in FIG. 1. When CMP is completed, the first feeding outlet 15 is closed to stop the supply of the polishing solution. From a second feeding outlet 16, pure water is supplied at a rate of about 3000 cc/min, and rinsing is performed for 30–60 seconds. CMP is performed at room temperature. Then, the wafer is maintained in such condition that it is not dried. The polishing solution is removed by brush scrubbing, and the wafer is dried using a rinser dryer or a spinner.

Using a wafer without an interconnect pattern, basic polishing performance of the polishing solution of the present invention may be evaluated. On a silicon wafer, a silicon oxide film of 200 nm in thickness is prepared. As an adhesive layer, TaN film of 30 nm in thickness, and Cu film of 2000 nm in thickness are continuously formed under vacuum condition by sputtering method. This may be used as the specimen. The wafer may be, for example, 5 inches in diameter.

The polishing solution used in the present embodiment is an aqueous solution, which comprises hydrogen peroxide (30 weight % $H_2O_2$ aqueous solution commercially available), orthophosphoric acid (hereinafter referred as "phosphoric acid"), α-hydroxypropionic acid (hereinafter referred as lactic acid), BTA, and methanol, and the polishing solution does not containing polishing abrasives. Its composition is as follows: Hydrogen peroxide 30 weight %, phosphoric acid 0.2 weight %, lactic acid 0.2 weight %, and imidazole 0.5 weight %. Using this phosphoric acid type abrasive-free polishing solution, Cu film polishing rate (speed) and etching rate (speed) may be determined. The measurement of these values is made through conversion from the changes of electric resistance values of the Cu film before and after the polishing, and before and after the etching. Polishing time may be set to 2 minutes, and etching time may be 10 minutes.

The resulting Cu polishing rate is controlled to less than 750 nm/min., and the etching rate to less than 1.0 nm/min., and there is no problem of dishing. It is possible to attain a polishing rate by more than 7 times as high as that of the conventional citric acid type abrasive-free polishing solution as disclosed in JP-A-11-135466 (e.g. a solution containing hydrogen peroxide of 30 weight %, citric acid of 0.15 weight %, and BTA of 0.2 weight %). The polishing rate for $SiO_2$ is less than 0.1 nm/min., and there is no problem of erosion.

When the above polishing solution contains no hydrogen peroxide, it is difficult to polish Cu (polishing rate: less than 50 nm/min.). Polishing rate is about 500 nm/min. when the polishing solution not containing lactic acid is used, and it is about 100 nm/min. when the polishing solution containing no phosphoric acid is used. Polishing rate is about 200 nm/min. when the polishing solution not containing imidazole is used. Etching rate is very high (i.e. 100 nm/min.), and is not suitable as a polishing solution for fabrication of a buried interconnect. In order to attain polishing rate of less than 750 nm/min., and an etching rate of less than 1.0 nm/min., the polishing solution preferably includes hydrogen peroxide, phosphoric acid, lactic acid and imidazole.

Using the above polishing solution, to which silica abrasives were added by 1%, a barrier metal TaN is polished. The may be performed by the same polishing procedure as the procedure for Cu as described hereinabove, and a polishing rate of 60 nm/min. may be attained. The polishing rate for TiN and Ta is 100 nm/min. and 50 nm/min. respectively. In the experiment for fabricating the buried interconnect as described hereinbelow, a description is given for a case wherein TaN is used as barrier metal film. For TiN and Ta, the experiment may be performed by the same procedure as given hereinabove and by changing the polishing time. The polishing rate for $SiO_2$ is less than 1 nm/min.

Figure 2A:
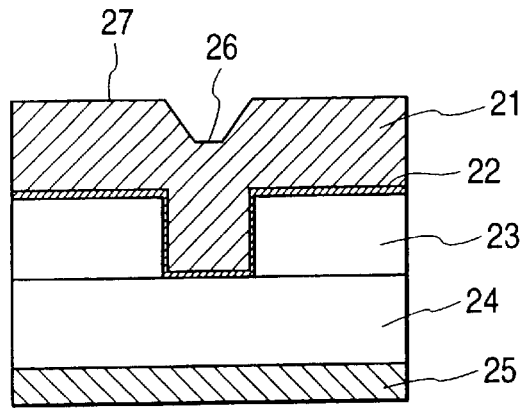
FIG. 2(a) shows cross-sectional structure of an interconnect of a specimen before CMP.

Alternatively, a polishing solution may be prepared using phosphorous acid, hypophosphorous acid, and metaphosphoric acid instead of phosphoric acid, and a polishing rate for Cu may be determined by the same procedure as hereinabove. The resulting polishing rate are 750 nm/min., 720 nm/min. and 700 nm/min. respectively. In each case, etching rate is suppressed to less than 1.0 nm/min. and there is no problem of dishing. Furthers from the results of microscopic examination of the polished surface, the phosphorous acid has a higher effect to suppress or control surface roughness of the polishing surface as compared with phosphoric acid. In any of these polishing solutions, the polishing rate for TiN is 100 nm/min., and the polishing rate for Ta and TaN is 50 nm/min. and 60 nm/min. respectively. The polishing rate for $SiO_2$ is less than 0.1 nm/min., and there is no problem of erosion.

Where a buried interconnect is fabricated using a polishing solution containing phosphoric acid, the same procedure as in the cases of other phosphoric acid type polishing solution, such as polishing solution containing phosphorous acid, hypophosphorous acid, metaphosphoric acid, etc., is followed. FIG. 2(a) shows an example of cross-sectional structure of the specimen before polishing. On a silicon substrate 25 where an impurity doping layer and an insulating film are formed, a BPSG film 24 (silicon oxide film added with boron and phosphorus) of 500 nm in thickness, and a silicon oxide film 23 of 500 nm in thickness, were formed. By a lithography process and a dry etching process, a groove pattern of 500 nm in depth for an interconnect is prepared in the silicon oxide film 23. A TaN layer 22 of 30 nm in thickness is formed as an adhesive layer, and a Cu thin film 21 of 800 nm in thickness is continuously formed under vacuum condition by sputtering methods. Further, in order to have better planarity of Cu film, vacuum heat treatment is performed for 3 minutes at 450 degrees Celsius in a sputtering system. On the silicon substrate 25, an impurity doping layer is formed, such as a source, drain, etc., and a detailed description of that formation will be apparent to those skilled in the art.

Figure 11A:
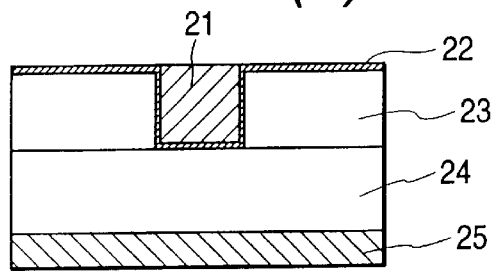
FIG. 11(a) shows cross-sectional structure of an interconnect of the specimen wherein the barrier metal remains after Cu-CMP.
Figure 11B:
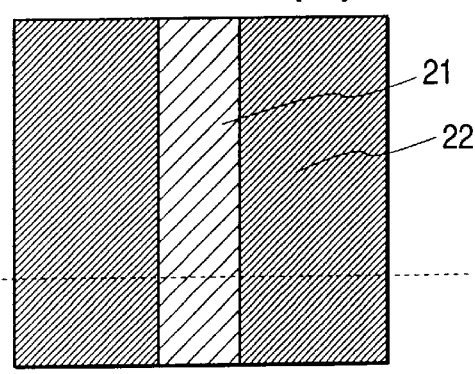
FIG. 11(b) is a plan view of the specimen, wherein the dotted line indicates position of the cross-section shown in FIG. 11(a)

For this specimen, CMP is performed on a first platen 84 as shown in FIG. 8, using the phosphoric acid type abrasive-free polishing solution as described above. As a result, the specimen may be polished in such shape that dishing and erosion are less than about 50 nm, as shown in FIGS. 11(a) and 11(b). Compared with a case using the conventional organic acid type abrasive-free polishing solution, the polishing may be completed in about ⅟7 the conventional polishing time. Neither delamination nor polishing scratches occur through the use of this method.

Figure 2B:
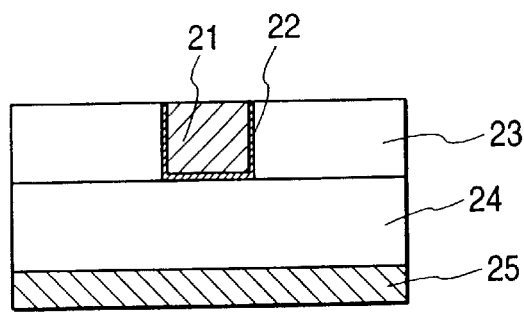
FIG. 2(b) shows cross-sectional structure of an interconnect of a specimen after CMP.
Figure 2C:
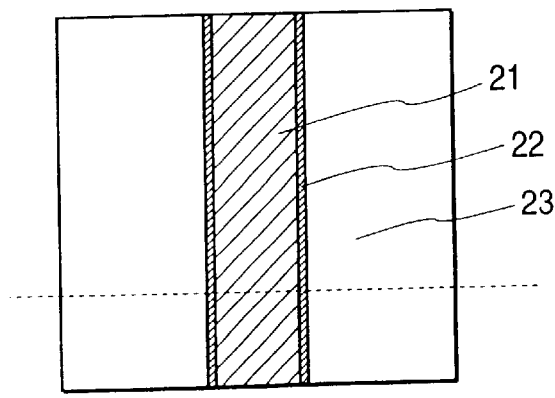
FIG. 2(c) is a plan view of the specimen after CMP, wherein the dotted line in FIG. 2(c) indicates position of the cross-section shown in FIG. 2(b)

The TaN is polished on a second platen 85 using a polishing solution, which is prepared by adding silica abrasives by 1% to the phosphoric acid type polishing solution as described hereinabove. The duration of polishing is 30 seconds. As shown in FIG. 2(b) and FIG. 2(c), polishing may be performed in such condition that dishing and erosion are less than about 50 nm. When both Cu and a barrier metal were polished on a platen (polishing pad), erosion occurred during abrasive-free polishing by the abrasive powder remaining on the polishing pad. This suggests that a polishing pad to be exclusively used for abrasive-free CMP should be prepared.

Figure 3A:
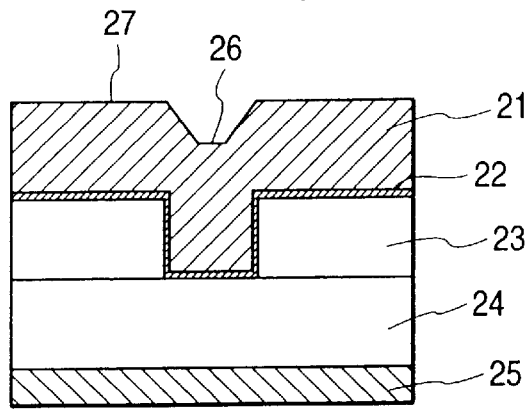
FIG. 3(a) shows cross-sectional structure of a plug of a specimen before CMP.
Figure 3B:
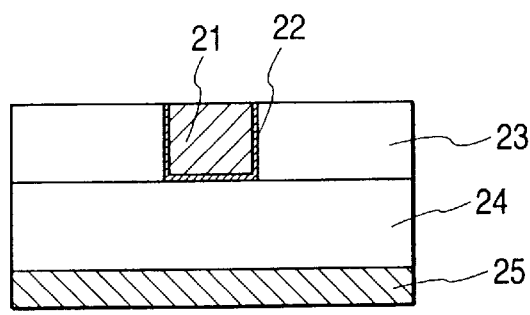
FIG. 3(b) shows cross-sectional structure of the plug unit of the specimen after CMP.
Figure 3C:
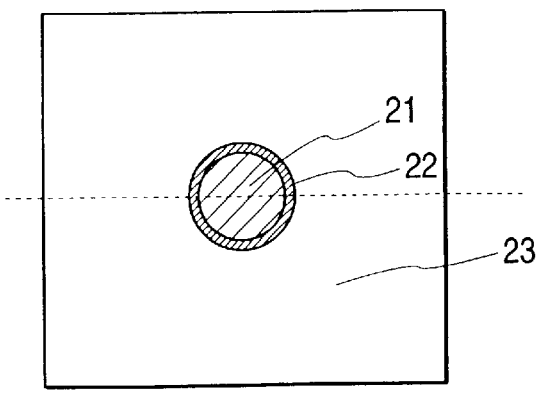
FIG. 3(c) is a plan view of the specimen after CMP, wherein the dotted line indicates position of the cross-section shown in FIG. 3(b)
Figure 12A:
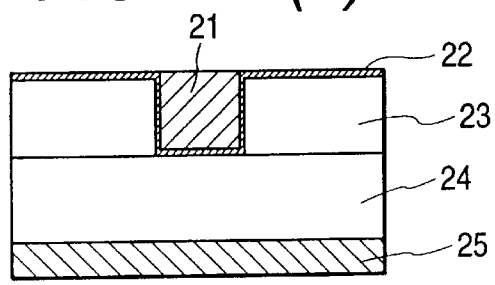
FIG. 12(2) shows cross-sectional structure of a plug of the specimen wherein the barrier metal remains after CU-CMP.
FIG. 12(b) is a plan view of the specimen, wherein the dotted line indicates position of the cross-section shown in FIG. 12(a)
Figure 12B:
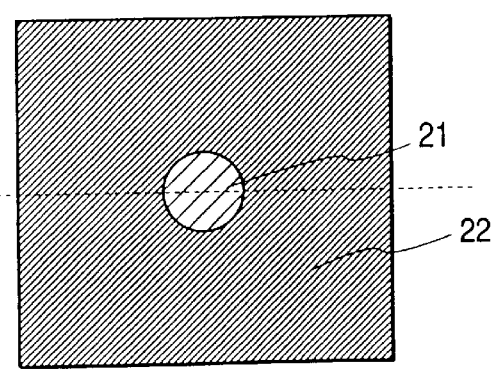

By performing CMP in two steps for the specimen of FIG. 3(a) according to the same procedure as that of the buried interconnect as described hereinabove, a plug structure of Cu, as shown in FIG. 3(b) and FIG. 3(c), may be prepared. FIG. 12 shows a condition wherein the barrier metal remains after Cu-CMP. In all of the stages, polishing may be performed to such extent that dishing and erosion are suppressed to less than about 50 nm. Neither delamination nor scratches occurred in experimentation. For the formation of the plug, Cu film is formed by an electroplating method known in the art, in order to improve the property of the Cu buried in the bore.

The concentration of imidazole in the polishing solution used for the polishing of the barrier metal as described hereinabove is 0.5 weight %, and the concentration may be the same as the concentration of the polishing solution used for Cu polishing. For the purposes of decreasing the polishing rate of Cu by the polishing solution for the barrier metal, and of reducing the dishing further, it is effective to increase the concentration of imidazole in the polishing solution for the barrier metal. For example, by increasing the concentration to 1.0 weight %, polishing rate for Cu can be reduced to about one half. There are known methods to add imidazole of this concentration into the polishing solution and known methods to supply 2% imidazole water to the platen at the same time as the polishing solution.

Electric resistivity of Cu interconnect prepared as shown in FIG. 2 is 1.9 $\mu\Omega$ cm, including the portion of TaN layer. Using a meander metal line pattern (line width 0.3–3 $\mu$m; length 40 mm), or comb-type metal line pattern (line spacing 0.3–3 $\mu$m; length 40 mm), a conductivity/insulation test may be performed. As a result, the yield is about 100%.

Figure 4:
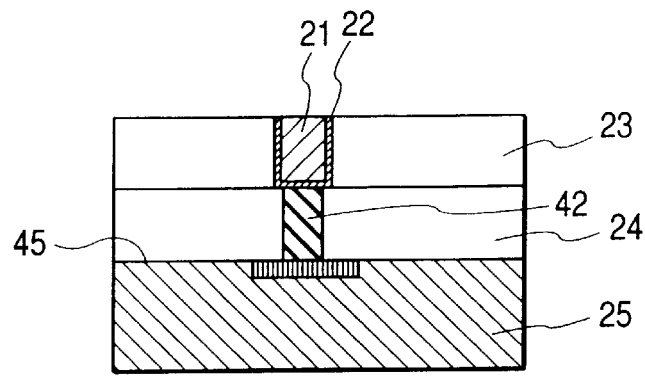
FIG. 4 is a cross-sectional view of a specimen wherein a plug and an interconnect are fabricated on a diffusion layer of a substrate using a polishing solution of the present invention.

Also, as shown in FIG. 4, normal conductivity is achieved from the impurity doping layer 45 to a tungsten plug 42, and LSI operation is normal.

Figure 5A:
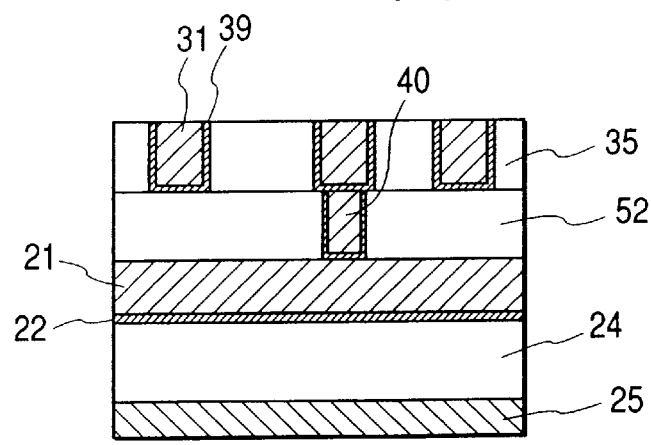
FIG. 5(a) shows cross-sectional structure of a specimen wherein a multi-level interconnection is fabricated using a polishing solution of the present invention.
Figure 5B:
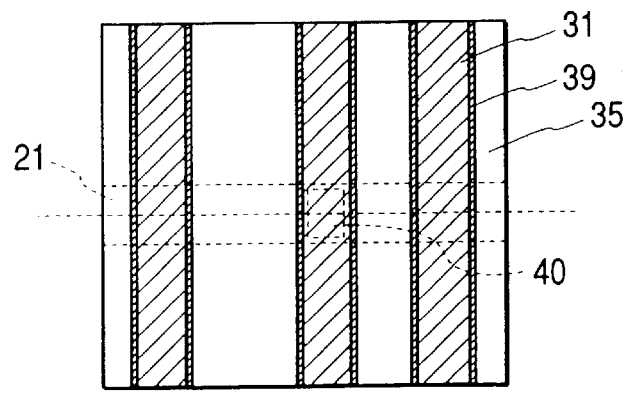
FIG. 5(b) is a plan view of the specimen, wherein the dotted line indicates position of the cross-section shown in FIG. 5(a)

By repeatedly carrying out the processes to manufacture the interconnect structure of FIG. 2, and the plug structure of FIG. 3, a multi-level interconnection structure as shown in FIG. 5 may be fabricated. The yield for plug conductivity achieved is nearly 100%, and normal operation of LSI is also achieved. The same conductivity performance may be achieved when Cu is used as the material for the plug, or when tungsten is used. In the case of tungsten, film deposition by CVD is more advantageous from the viewpoint of buried property, and there is no need to use an adhesive metal film such as TiN or Ti.

Figure 6A:
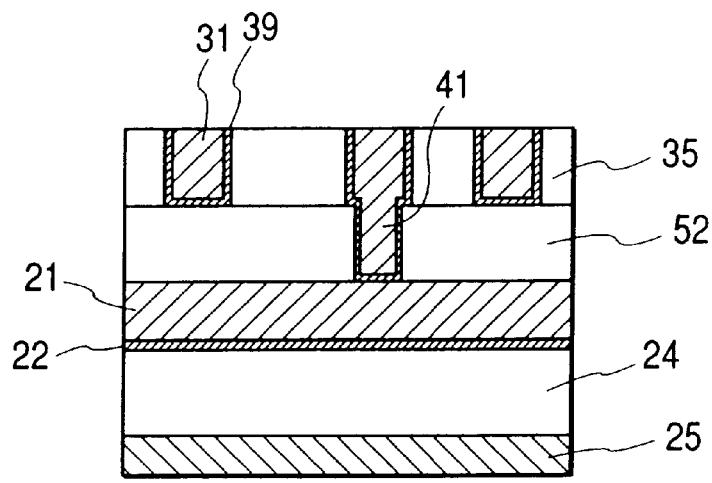
FIG. 6(a) shows cross-sectional structure of the specimen wherein a multi-level interconnection is fabricated by dual damascene method using the polishing solution of the present invention.
Figure 6B:
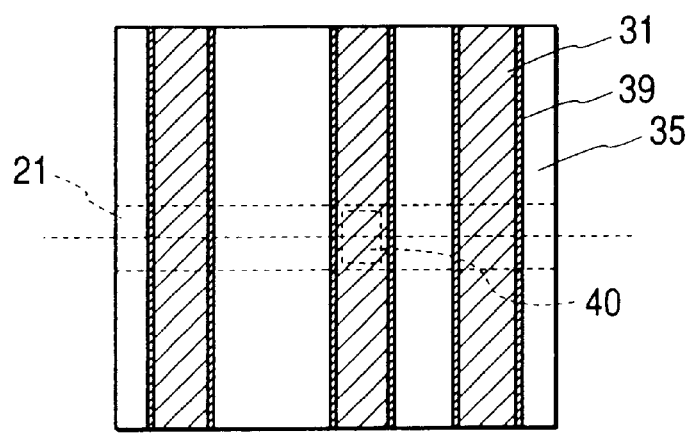
FIG. 6(b) is a plan view of the specimen, wherein the dotted line indicates position of the cross-section of FIG. 6(a)

Further, by similar polishing methods, it is also possible to prepare a plug 41 formed by dual damascene method, as shown in FIG. 6. This allows for a reduction in the number of processes of multi-level interconnection. Normal operation of LSI is also achieved in this method.

Figure 13:
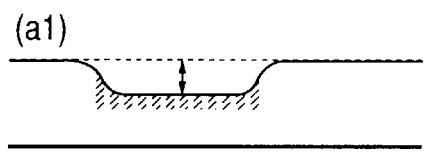
FIGS. 13(a1) to 13(a5) each represent a cross-sectional structure of the specimen formed by a conventional polishing method, and FIGS. 13(b1) to 13(b4) each represent a cross-sectional structure of the specimen formed by the polishing method of the present invention.
Figure 13:
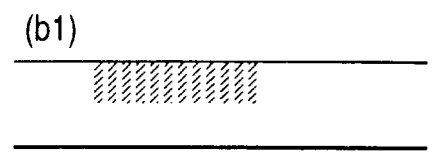
Figure 13:
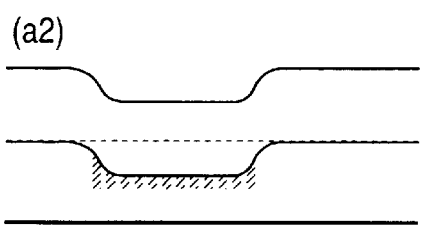
Figure 13:
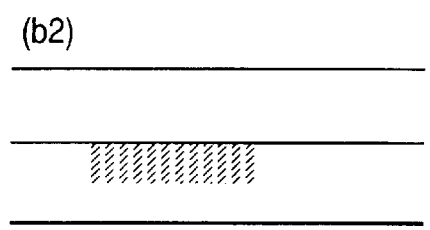
Figure 13:
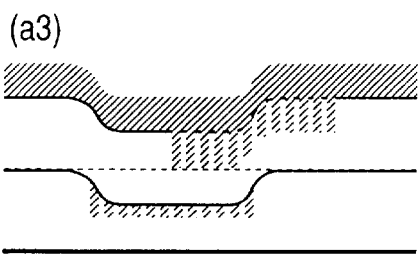
Figure 13:
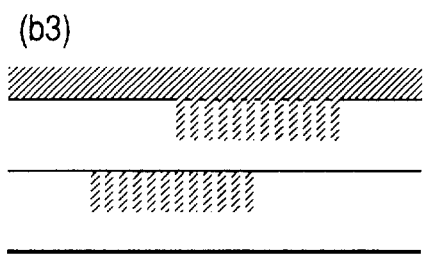
Figure 13:
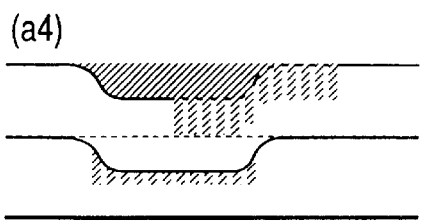
Figure 13:
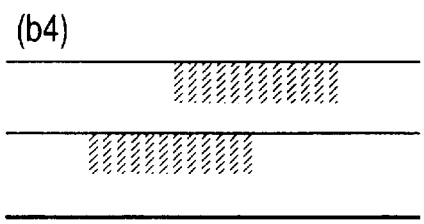
Figure 13:
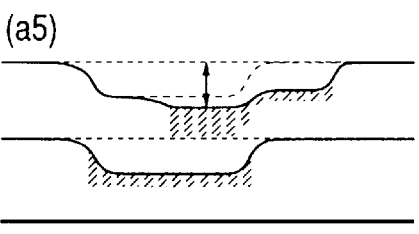

Using the interconnect-fabrication method shown in FIG. 5 and FIG. 6, and by the plug fabrication method, it is possible to prepare an interconnect of LSI with three or more layers. As shown in FIGS. 13(a1) to 13(a5), when CMP is performed using the conventional type polishing solution, more polishing residues are generated on the upper layers, due to dishing and erosion that occurs in the lower layers. FIG. 13(a4) shows how polishing residues are generated. To remove these polishing residues, over-CMP time is increased more in the upper layers, and this further accelerates dishing and erosion. As a result, as shown in FIG. 13(a5), dishing and erosion are increased in the upper layers. When there are 3 or more interconnect layers, polishing residues are increased further. When an attempt is made to remove these residues, more than one-half of the interconnect in the dense region may be eliminated due to erosion. Specifically, by the conventional polishing method, it is difficult to reduce dishing and erosion to less than 50 nm. Also, when interconnect layers are produced up to 7 layers, it is naturally difficult to reduce them to less than 100 nm.

By using the polishing method of the present invention, it is possible to reduce and suppress dishing and erosion to less than 50 nm, even where no polishing residues are generated and the interconnect layers are produced up to a third layer as shown in FIG. 13(b4). Even where the layers are produced up to a seventh layer as shown in FIG. 9, it is possible to suppress dishing and erosion to less than 80 nm.

Figure 9:
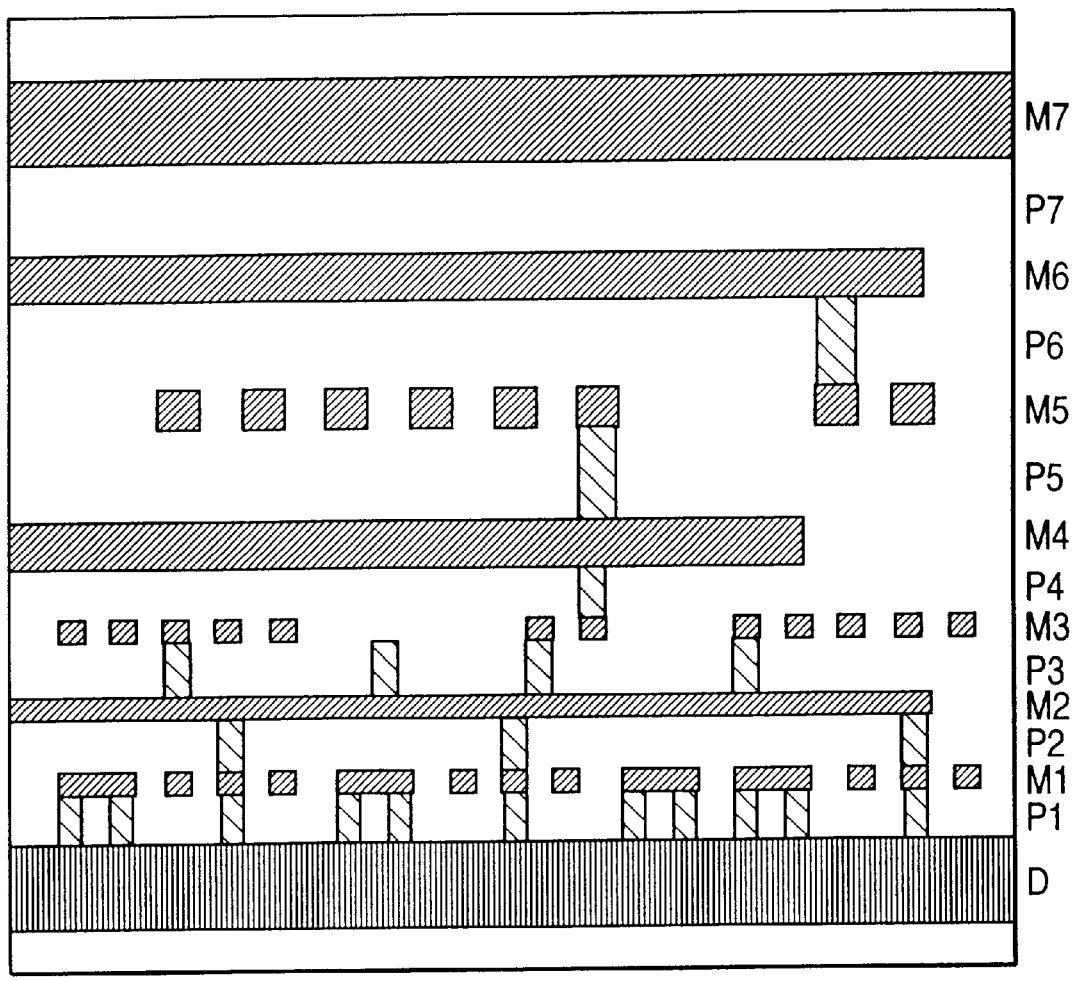
FIG. 9 is a drawing to show cross-sectional structure of the specimen wherein multi-level interconnection is fabricated using a polishing solution of the present invention.

FIG. 9 shows a case wherein single damascene method is adopted. CMP is repeatedly performed 14 times (M1–M7; P1–P7), including the formation of the plug. When formation is by dual damascene, it is possible to suppress dishing and erosion to less than 80 nm.

Figure 10A:
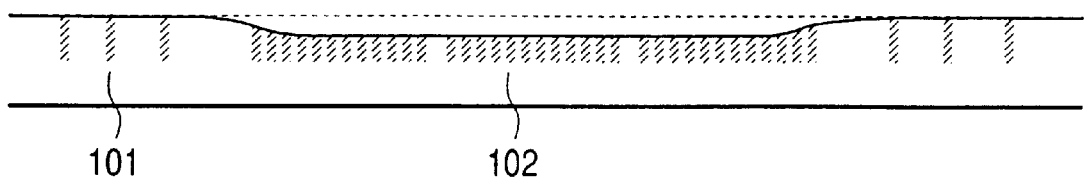
FIG. 10(a) is a drawing to show cross-sectional structure of the specimen wherein a peripheral circuit and a LSI interconnect layer with a memory array are fabricated by a conventional polishing method.

FIG. 10 shows a memory array 102 and a peripheral circuit 101 in an LSI chip. In the memory array, metal lines are densely arranged. The difference in pattern density is large in the memory array as compared to the peripheral circuit. When conventional type polishing methods are used, the time of over-CMP is longer on the memory array. As shown in FIG. 10(a), erosion and dishing tend to increase as compared to the logic unit. When this is carried out in multi-layer arrangement, the problem explained in connection with FIG. 13(a) occurs. When three layers or more are laminated, wiring resistance extensively increases.

Figure 10B:
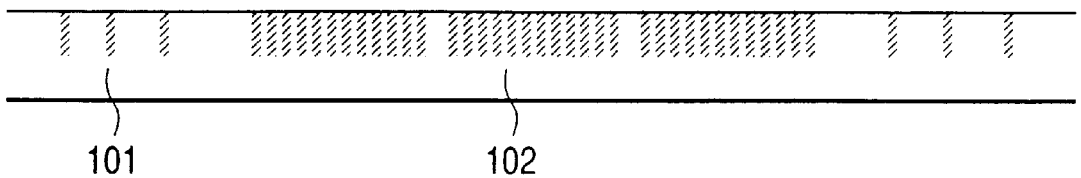
FIG. 10(b) is a drawing to show cross-sectional structure of the specimen wherein a peripheral circuit and an LSI interconnect layer with a memory array are fabricated by the method of the present invention.

In contrast, according to the polishing method of the present invention, the resistance to over-CMP is high. Thus, even in the case wherein an LSI having portions with differences in pattern density coexistent on the same chip, it is possible to suppress dishing and erosion to less than 50 nm, as shown in FIG. 10(b). Also, it is possible to form three layers or more without causing an increase in wiring resistance.

Also, in the case of a system LSI wherein the logic unit, memory unit, etc. coexist, the polishing method of the present invention can be applied.

By adding BTA by 0.2 weight % as a second chemical to form the inhibition layer, it is possible to suppress Cu etching rate by one-half. However, the polishing rate is decreased by about 50 nm/min. When methanol is added by 1% at the same time as BTA, it is possible to increase the solubility of BTA.

EXAMPLE 2

The polishing solution for Cu used in a second embodiment is an aqueous solution including hydrogen peroxide (30% $H_2O_2$ aqueous solution commercially available), phosphoric acid, lactic acid, BTA, and ammonium salt of polyacrylic acid. The composition is: hydrogen peroxide 30 weight %, phosphoric acid 0.2 weight %, lactic acid 0.5 weight %, BTA 0.2 weight %, and ammonium salt of polyacrylic acid 0.1 weight %. Using this polishing solution, polishing rate and etching rate for a Cu film were determined. Polishing performance is evaluated by the same procedure as in Example 1 hereinabove. For the polishing of barrier metal film, silica abrasive powder is added by 1% to the above polishing solution.

As a result, polishing rate for Cu is suppressed to less than 700 nm/min. and etching rate to less than 1.0 nm/min., and there is no problem of dishing. Compared with the case of a conventional organic acid type abrasive-free polishing solution, the polishing rate is by about 7 times higher. Polishing rate for $SiO_2$ is less than 0.1 nm/min., and there is no problem of erosion.

When silica abrasives are added by 1% to the polishing solution, the polishing rate for TaN is 60 nm/min. The polishing rates for TiN and Ta are 100 nm/min. and 50 nm/min., respectively. In this embodiment, TaN is used. For TiN and Ta, polishing may be achieved by the same procedure by changing the polishing time. The polishing rate for $SiO_2$ is less than 1 nm/min.

The specimen for fabricating the buried interconnect is polished by CMP in two steps using the above polishing solution. As a result, polishing may be performed with dishing and erosion controlled to less than about 50 nm, as shown in FIG. 2(b) and FIG. 2(c). Cu polishing may be achieved in about 1/7 of the time required in the case wherein the conventional organic acid type abrasive-free polishing solution is used. Neither delamination nor polishing scratches occur using the present invention. As shown in FIG. 3(b) and FIG. 3(c), the plug structure may also be fabricated by controlling dishing and erosion to less than 50 nm.

When electric resistivity of a Cu interconnect thus formed is measured, it is 1.9 $\mu\Omega$ cm, including the portion of TiN layer. Using meander metal line pattern (line width 0.3–3 $\mu$m; length 40 mm) or comb-type metal line pattern (line spacing 0.3–3 $\mu$m; length 40 mm), a conductivity/insulation test may be performed. As a result, the yield is nearly 100%. It is also possible to produce multi-level interconnection structures, as shown in FIG. 5 and FIG. 6. LSI operation is normal in the present invention.

In the present embodiment, ammonium salt of polyacrylic acid is used. When cetyl pyridinium chloride of the same concentration is used instead, it is possible to attain the above polishing rate and to prevent mildew and bacteria in the polishing solution in storage or in waste liquid.

The ammonium salt of polyacrylic acid used in the present embodiment has a molecular weight of about 10,000. When a compound with a molecular weight of about 100,000 is used, it is possible to increase the polishing rate for Cu by 20%. Further, when cross-linking type ammonium salt of polyacrylic acid with a molecular weight of more than 1,000,000 is used, it is possible to increase Cu polishing rate by 30%.

EXAMPLE 3

In the present embodiment, a Cu interconnect is compared in the case wherein CMP is performed in one step on the specimen for forming buried Cu interconnect using the polishing solution containing silica abrasives, and in the case wherein polishing is performed in two steps by the same procedure as in Example 1.

The polishing solution used in the present embodiment is an aqueous solution, which includes hydrogen peroxide (30% $H_2O_2$ aqueous solution commercially available), phosphoric acid, lactic acid, and imidazole. The composition is: hydrogen peroxide 30 weight %, phosphoric acid 0.2 weight %, lactic acid 0.2 weight %, and imidazole 0.5 weight %. Further, silica abrasives may be added by 1% to this polishing solution. Using these two types of polishing solutions, polishing rate and etching rate for Cu film were determined. Polishing performance is evaluated by the same procedure as in Example 1.

As a result, when the polishing solution containing silica abrasive is used, the polishing rate of Cu is controlled to less than 1000 nm/min., and the etching rate to less than 1.0 nm/min., and there is no problem of dishing. When the polishing solution not containing silica abrasive is used, the polishing rate for Cu is 750 nm/min, which is similar to that of Example 1.

When the polishing solution containing silica abrasives is used, the polishing rate for TiN is 100 nm/min., but when the polishing solution not containing silica abrasives is used, the polishing rate for Ta is 50 nm/min. (solution containing abrasives) and 15 nm/min. (solution containing no abrasive), respectively. The polishing rate for TaN is 60 nm/min. (solution containing abrasives) and 15 nm/min. (solution containing no abrasive), respectively. In the experiment described hereinbelow, TiN is used as the barrier metal film. For Ta and TaN, the experiment may also be performed by the same procedure by changing the duration of polishing.

Figure 7A:
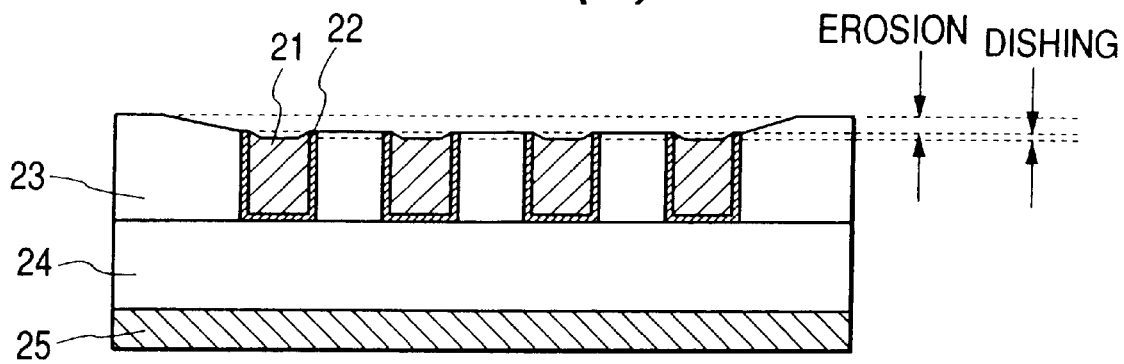
FIG. 7(a) is a cross-sectional view of the specimen wherein CMP is performed using a polishing solution with abrasive powder.
Figure 7B:
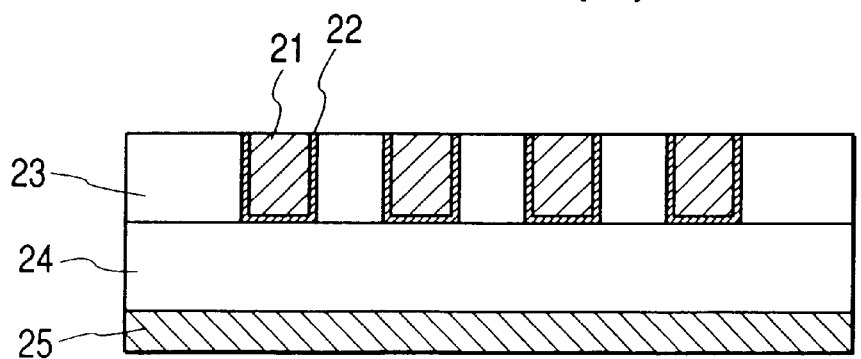
FIG. 7(b) is a cross-sectional view of the specimen when CMP is performed using the abrasive-free polishing solution.

A Cu interconnect is compared in the case wherein CMP is performed in one step (on a single platen for Cu film and TiN film) using the polishing solution containing silica abrasive on a specimen for fabricating a buried Cu interconnect, and in the case wherein polishing is performed in two steps (on two platens) by the same procedure as in Example 1. When polishing is performed in one step, the polished shape is as shown in FIG. 7(a), and erosion of more than 50 nm occurred. Dishing is controlled to less then 50 nm. FIG. 7(b) shows the result of the case wherein the same interconnect structure of the specimen is polished by two-step CMP. It is noted that the extent of the erosion differs dependent upon whether the polishing solution, contains abrasives. When polishing scratches are examined using a surface particle counter, in the case of one-step polishing, there are several tens to several hundreds of polishing scratches. Despite these problems, in the one-step CMP, polishing may be completed in about ¼ of the time required for the two-step CMP, when the polishing time for TiN is included, thus improving throughput.

When the electric resistivity of a Cu interconnect polished by one-step CMP is determined, it is 1.9 $\mu\Omega$ cm, including TiN layer (thickness loss is taken into consideration).

However, wiring resistance is about 10% higher than the value obtained in the two-step CMP. This may cause increased development of erosion. Further, using meander metal line pattern (line width 0.3–3 $\mu$m; length 40 mm) and comb-type metal line pattern (line spacing 0.3–3 $\mu$m; length 40 mm), a conductivity/insulation test may be performed. As a result, the yield is nearly 100%. When multi-level interconnection is prepared and LSI operation is assessed, normal LSI operation is achieved. There is no influence on the yield, even when CMP is carried out in one step, but wiring resistance is increased due to erosion.

EXAMPLE 4

In this embodiment, a complete abrasive-free process using barrier metal removal by dry etching method is employed. For the dry etching, $SF_6$ (sulfur hexafluoride) is used. Gas flow rate is 25 cc/min., processing pressure is 5 mmTorr, high frequency output for plasma is 600 W, and high frequency output for bias is 0–100 W. Under these conditions, etching selection ratio is determined between the barrier metal film and the $SiO_2$ film. The higher the bias power is, the more the etching rate is increased, but the selection ratio is maximized when bias power is not applied. When bias power is 0, $TiN/SiO_2$ selection ratio is 15, and $TaN(Ta)/SiO_2$ selection ratio is 11. In the case of TiN or TaN, the etching effect due to F radicals is high. In the case of $SiO_2$, etching is difficult to achieve simply by F radicals, and it is necessary to employ the acceleration effect of ions caused by application of bias power. No etching is performed for Cu under this condition. The dry etching rate is 320 nm/min. for TiN, and 240 nm/min. for TaN.

A description is given hereinbelow of a Cu interconnect formed using the above drying etching method. TaN is used as barrier metal. The procedure is the same as was discussed in the case of TiN hereinabove. For Cu-CMP, the same procedure is performed using phosphoric acid type abrasive-free polishing solution as was described hereinabove. The wafer may be washed by brush scrubbing and dried, and the TaN film is removed under the above conditions using a dry etching system. Then, fabrication may be performed wherein dishing and erosion are controlled to less than about 50 nm/min. as shown in FIG. 2(b) and FIG. 2(c). The structure, as shown in FIG. 3(b) and FIG. 3(c), may be prepared for the plug. In this case, Cu film is formed by the electroplating methods already known in the art to thereby improve the buried property of Cu film. Dishing and erosion may be controlled to less than about 50 nm. Neither delamination nor polishing scratches occur.

When electric resistivity of a Cu interconnect produced by the above method is determined, it is 1.9 $\mu\Omega$ cm, including the portion of TaN layer. Using meander metal line pattern (line width 0.3–3 $\mu$m; length 40 mm) and comb-type metal line pattern (line spacing 0.3–3 $\mu$m; length 40 mm), a conductivity/insulation test may be performed. As a result, the yield is nearly 100%.

Further, as shown in FIG. 4, normal conductivity is obtained from the impurity doping layer 45 to the tungsten plug 42, and LSI operation is also normal.

By repeatedly performing the process to manufacture the interconnect structure of FIG. 2 and the plug structure of FIG. 3, it is possible to build up a multi-level interconnection as shown in FIG. 5. The yield of conductivity of the plug is nearly 100%, and the LSI operates normally. Regardless of whether the material for the plug is Cu or tungsten, the same conductivity may be achieved. In case of tungsten, film deposition by CAD is more advantageous for burying performance, and the boding metal may not be used. In this case, tungsten CAMP is performed.

Further, it is also possible to fabricate the plug 41 formed by dual damascene as shown in FIG. 6. As a result, the number of processes to manufacture multi-level interconnection may be decreased.

EXAMPLE 5

In this embodiment, a complete abrasive-free process is performed to remove the barrier metal by an abrasive-free CMP. TiN is used as the barrier metal. Regarding Cu-CMP, the same procedure is performed using phosphoric acid type abrasive-free polishing solution, as described hereinabove. The polishing solution for TiN is an aqueous solution, which includes hydrogen peroxide, nitrobenzene sulfonic acid, and BTA. The composition is: hydrogen peroxide 20 weight %, nitrobenzene sulfonic acid 10 weight %, and BTA 0.3 weight %. When this polishing solution is used, the polishing rate is less than 50 nm/min. for TiN, and less than 1 nm/min. for Cu. That is, the selection ratio is more than 50 times higher than onventional methods.

Under the above condition, a two-step abrasive-free CMP is carried out. As shown in FIG. 2(b) and FIG. 2(c), dishing and erosion are controlled to less than about 50 nm. Regarding the plug, it is also possible to fabricate the structure as shown in FIG. 3(b) and FIG. 3(c). In this case, Cu film is formed by the electroplating methods known in the art, in order to improve burying performance. Also, in this case, the specimen is fabricated such that dishing and erosion are less than about 50 nm. Neither delamination nor polishing scratches occur.

When electric resistivity of Cu interconnect prepared by the above method is determined, it is 1.9 $\mu\Omega$ cm, including the portion of TiN layer. Using meander metal line pattern (line width 0.3–3 $\mu$m; length 40 mm) and comb-type metal line pattern (line spacing 0.3–3 $\mu$m; length 40 mm), a conductivity/insulation test may be performed. As a result, the yield is nearly 100%.

As shown in FIG. 4, normal conductivity is attained from the impurity doping layer 45 to the tungsten plug 42, and LSI operation is normal.

By repeatedly performing the process to manufacture the interconnect structure of FIG. 2 and the plug structure of FIG. 3, it is possible to build up multi-level interconnection as shown in FIG. 5. The yield of conductivity of the plug is nearly 100%, and normal operation of LSI is achieved. Regardless of whether the material for the plug is Cu or tungsten, the same conductivity may be achieved. In the case of tungsten, it is more advantageous to form the film by CVD for burying performance, and bonding metal may not be used. Also, tungsten CMP is performed in this case.

Further, the plug 41 may be prepared by dual damascene as shown in FIG. 6. As a result, the number of processes to manufacture multi-level interconnection may be decreased.

The method to perform CMP using a polishing solution containing phosphoric acid and an organic acid reduces or suppresses scratches and delamination, suppresses and controls the development of dishing and erosion, and to carries out the polishing operation at higher polishing rate. Other advantages and benefits of the present invention will be apparent to those skilled in the art.

The present invention is not limited in scope to the embodiments discussed hereinabove. Various changes and modifications will be apparent to those skilled in the art, and such changes and modifications fall within the spirit and scope of the present invention. Therefore, the present invention is to be accorded the broadest scope consistent with the detailed description, the skill in the art and the following claims.

What is claimed is:

1. A polishing method for removing at least a portion of a metal film formed on an insulating film, comprising:
   providing to the at least a portion of the metal film a polishing solution comprising:
      an oxidizer;
      a phosphoric acid;
      an organic acid;
      an inhibitor comprising an anti-corrosive agent and a polymer; and
   mechanically scrubbing the at least a portion of the metal film in the provided polishing solution.

2. The method of claim 1, wherein the organic acid is selected from the group consisting of carboxylic acid and hydrocarboxylic acid.

3. The method of claim 1, wherein the organic acid is lactic acid.

4. The method of claim 1, wherein the phosphoric acid is selected from the group consisting of orthophosphoric acid and phosphorous acid.

5. The method of claim 1, wherein the oxidizer is hydrogen peroxide.

6. The method of claim 1, wherein the anti-corrosive agent is selected from the group consisting of benzotriazole and benzotriazole derivative.

7. A polishing method for removing at least a portion of a metal film formed on an insulating film, comprising:
   providing to the at least a portion of the metal film a polishing solution comprising:
      an oxidizer;
      a phosphoric acid;
      an organic acid;
      an inhibitor comprising an anti-corrosive agent selected from the group consisting of imidazole and imidazole derivative; and
   mechanically scrubbing the at least a portion of the metal film in the provided polishing solution.

8. The method of claim 7, wherein the inhibitor further comprises a polymer.

9. The method of claim 1, wherein the polymer is selected from the group consisting of a surface active agent and a thickener.

10. The method of claim 1, wherein the polymer is selected from the group consisting of a polyacrylic acid, an ammonium salt of polyacrylic acid, and an amine salt of polyacrylic acid.

11. The method of claim 1, wherein the polishing solution further comprises:
   a solvent for increasing solubility of the anti-corrosive agent in the polishing solution.

12. The method of claim 11, wherein the solvent is an alcohol.

13. The method of claim 12, wherein the alcohol is selected from the group consisting of methanol, ethanol, and isopropyl alcohol.

14. The method of claim 1, wherein an etching rate of the polishing solution for the metal film is less than 10 nm/min.

15. The method of claim 1, wherein the polishing solution further comprises an abrasive powder.

16. The method of claim 15, wherein the abrasive powder is selected from the group consisting of alumina and silica.

17. The method of claims 1, wherein the metal film contains at least one item selected from the group consisting of Cu, an alloy containing Cu as a main component, and a Cu compound.

18. A polishing method for removing at least a portion of a Cu film, comprising:
  polishing, wherein said polishing comprises:
    providing to the at least a portion of the Cu film a polishing solution comprising:
      hydrogen peroxide;
      phosphoric acid;
      lactic acid; and
      an inhibitor comprising an anti-corrosive agent and a polymer; and
    mechanically scrubbing the at least a portion of the Cu film in the provided polishing solution.

19. A polishing method for removing at least a portion of a Cu film, comprising:
  polishing, wherein said polishing comprises:
    providing to the at least a portion of the Cu film a polishing solution comprising:
      hydrogen peroxide;
      phosphoric acid;
      lactic acid; and
      an inhibitor comprising a polymer and an imidazole derivative; and
    mechanically scrubbing the at least a portion of the Cu film in the provided polishing solution.

20. The method of claim 14, wherein an etching rate of the polishing solution is about 1 nm/min.

* * * * *